(12) United States Patent
Hu

(10) Patent No.: US 6,593,234 B2
(45) Date of Patent: Jul. 15, 2003

(54) METHODS OF UTILIZING METAL RICH SILICIDE IN FORMING SEMICONDUCTOR CONSTRUCTIONS

(75) Inventor: Yongjun Jeff Hu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/912,650

(22) Filed: Jul. 24, 2001

(65) Prior Publication Data

US 2003/0022490 A1 Jan. 30, 2003

(51) Int. Cl.[7] .............................................. H01L 21/44
(52) U.S. Cl. ....................... 438/664; 438/649; 438/651; 438/655; 438/682; 438/683
(58) Field of Search ................. 438/649, 651, 438/655, 664, 682, 683

(56) References Cited

U.S. PATENT DOCUMENTS

| | | | | |
|---|---|---|---|---|
| 4,504,521 A | * | 3/1985 | Widmer et al. | 438/655 |
| 4,663,191 A | * | 5/1987 | Choi et al. | 438/682 |
| 5,525,543 A | * | 6/1996 | Chen | 438/643 |
| 5,639,678 A | * | 6/1997 | Lee et al. | 438/308 |
| 6,329,276 B1 | * | 12/2001 | Ku et al. | 438/586 |

* cited by examiner

Primary Examiner—Matthew Smith
Assistant Examiner—Belur V Keshavan
(74) Attorney, Agent, or Firm—Wells St. John P.S.

(57) ABSTRACT

The invention includes a method of forming a semiconductor construction. A metal-rich metal silicide layer is formed on a silicon-comprising substrate, and a metal nitride layer is formed on the metal-rich metal silicide layer. The metal-rich metal silicide layer and metal nitride layer are thermally processed to convert some of the metal-rich metal silicide into a stoichiometric metal silicide region. The thermal processing also drives nitrogen from the metal nitride layer into the metal-rich metal silicide layer to convert some of the metal-rich metal silicide layer into a region comprising metal, silicon and nitrogen. The invention also includes semiconductor constructions comprising a layer of $MSi_2$ and a layer of $MSi_qN_r$, where M is Ta, W or Mo, and both q and r are greater than 0 and less than 2.

20 Claims, 3 Drawing Sheets

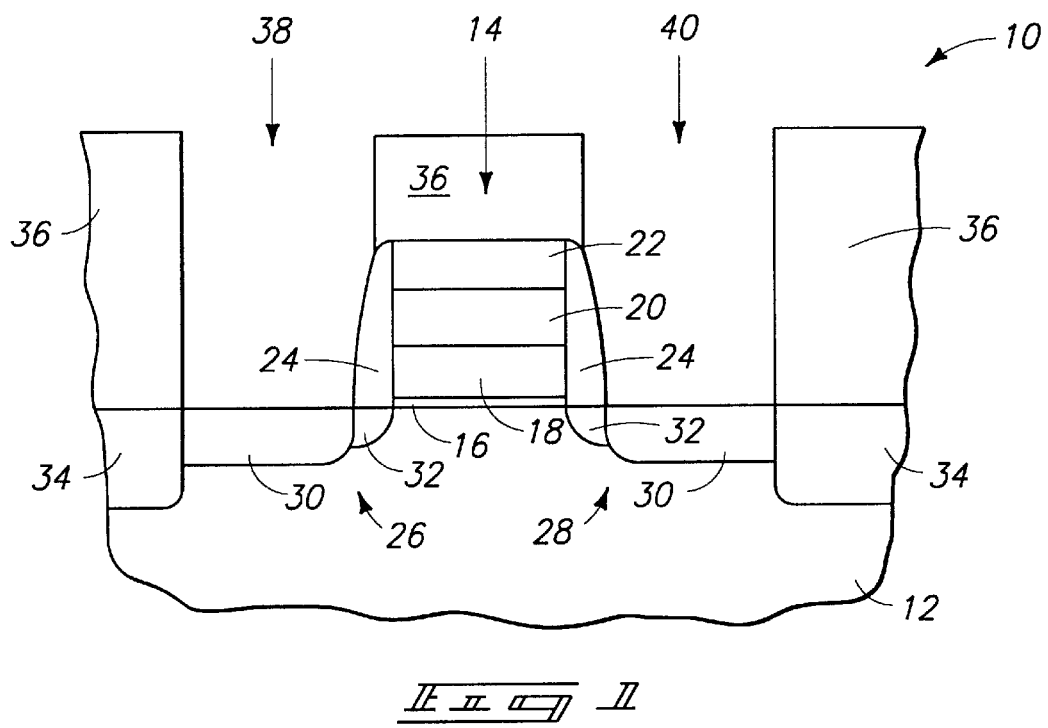
_Fig. 1_
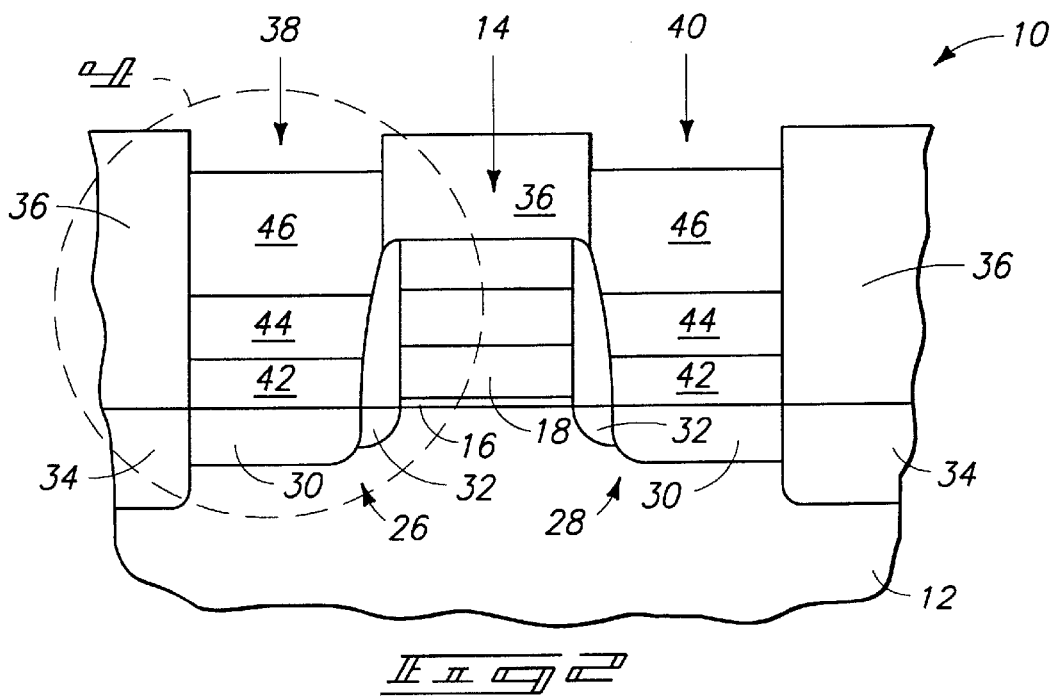
_Fig. 2_

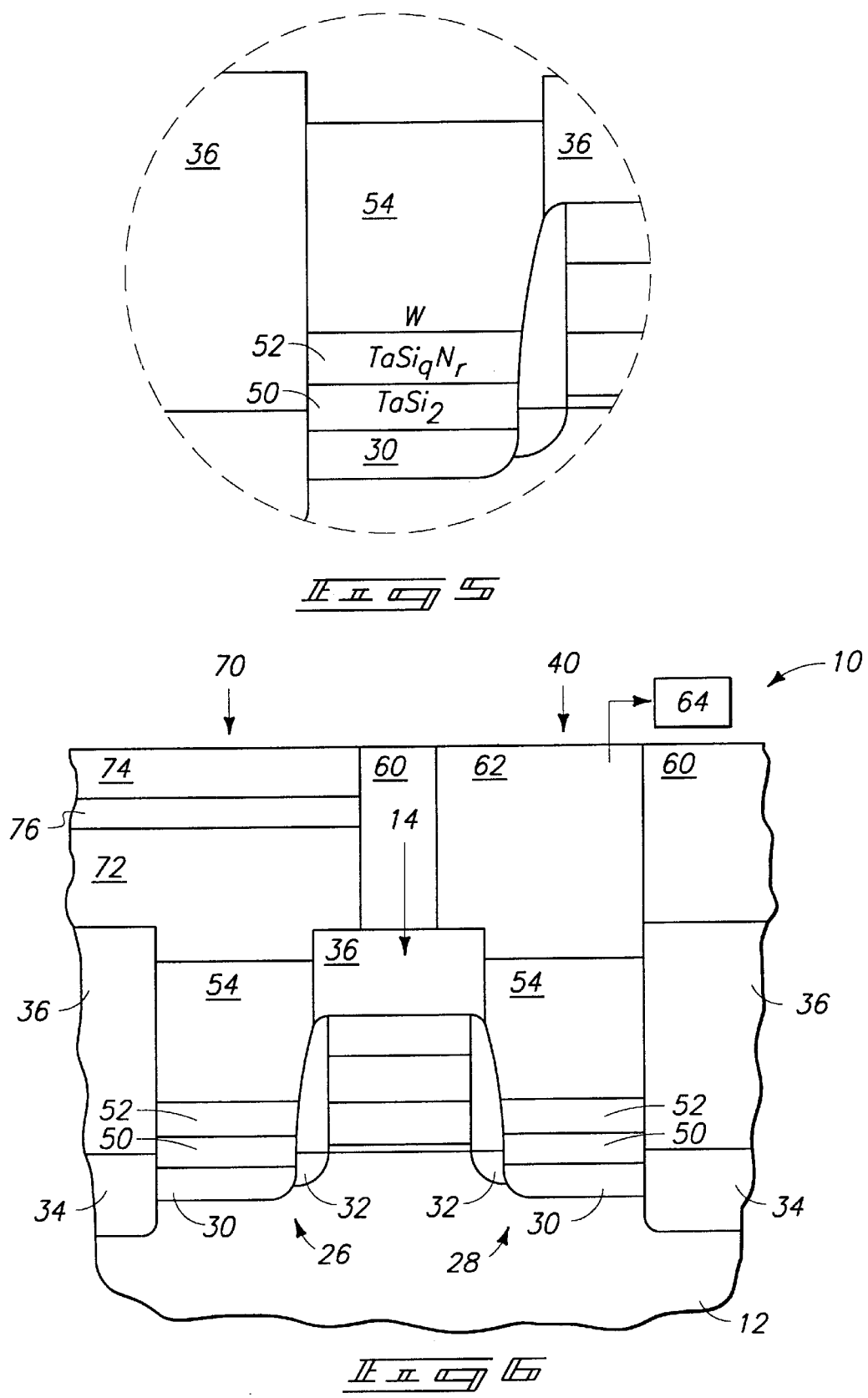

METHODS OF UTILIZING METAL RICH SILICIDE IN FORMING SEMICONDUCTOR CONSTRUCTIONS

TECHNICAL FIELD

The invention pertains to methods of forming electrical connection to semiconductor electrical nodes, and to structures comprising electrical connections to semiconductor electrical nodes.

BACKGROUND OF THE INVENTION

Semiconductor device fabrication frequently includes formation of diffusion regions in silicon-comprising substrates, and subsequent formation of electrical contacts to the diffusion regions. The diffusion regions can, for example, be source/drain regions associated with transistor gates, and the silicon-comprising substrates can, for example, be either polycrystalline silicon, amorphous silicon, or monocrystalline silicon.

Several methods have been developed for forming electrical contacts to diffusion regions, but frequently problems are associated with the methods. For instance, one method of forming an electrical contact to a diffusion region is simply to physically contact the diffusion region with an electrical interconnect comprising conductively-doped silicon. Such methodology can be effective in applications in which the diffusion region and the conductively-doped silicon are both doped to a same conductivity type (for example, in which the diffusion region and the conductively-doped silicon of the interconnect are both doped to be n-type). However, if the conductively-doped silicon interconnect has a different conductivity type than the diffusion region, the interconnect cannot simply be physically contacted with the diffusion region or a diode will develop at an interface of the interconnect and the diffusion region.

It is common for both n-type and p-type diffusion regions to be formed across a silicon-containing substrate, and it is frequently desired to simultaneously form conductive contacts with both the p-type diffusion regions and the n-type diffusion regions. Further, since it is usually easier to form n-type doped silicon as a conductive interconnect than p-type doped silicon, it can be desired to form n-type doped silicon as a conductive interconnect material across an entirety of a substrate. However, for the reasons discussed above, an n-type doped silicon interconnect can generally not be utilized to directly contact a p-type doped diffusion region, and accordingly it is generally not practical to form n-type doped silicon interconnects extending to both p-type doped diffusion regions and n-type doped diffusion regions.

Several methods have been developed to overcome the above-described problem. One method is to mask all of the n-type doped diffusion regions, and to then form p-type doped polysilicon interconnects extending to the p-type doped diffusion regions. Subsequently, the mask is formed over the p-type doped polysilicon interconnects and p-type doped diffusion regions, and n-type doped silicon interconnects are formed to the n-type doped regions. Another method which has been developed is to form a conductive layer over the p-type diffusion regions and n-type diffusion regions, and to subsequently form the n-type doped silicon over the conductive layer. The conductive layer typically comprises metal silicide (either alone or in combination with layers of metal nitride and/or other metal-comprising layers), and prevents the direct physical connection of n-type polysilicon with p-type polysilicon. The conductive layer accordingly eliminates interfaces between n-type doped silicon and p-type doped silicon, and the problems associated therewith.

The utilization of conductive layers as interfaces between diffusion regions and interconnecting conductively-doped silicon is becoming particularly common in fabrication processes in which p-type doped diffusion regions and n-type doped diffusion regions occur in close proximity to one another, such as, for example, in applications in which memory circuitry has logic circuitry embedded therein (such as, for example, so-called embedded dynamic random access memory, also known as EDRAM.)

Metal silicide layers are typically formed over diffusion regions by depositing metal on the diffusion regions, and then subsequently reacting the metal with silicon of the diffusion regions to form the metal silicide. A difficulty with such processing is that a significant amount of silicon can be utilized in forming the metal silicide, which can reduce an effective size of a diffusion region. Such problems can be severe in applications in which diffusion regions are initially shallow.

Another problem that can occur in forming the metal silicide is specific for particular types of metal silicide. For instance, a commonly utilized metal silicide is titanium silicide. However, titanium silicide can agglomerate at processing conditions generally utilized for formation of semiconductor devices (such as, for example, processing conditions of 850° C. to 1,000° C.), and can thus become a less effective conductive material than is desired for particular applications.

It would be desirable to develop new structures for electrically contacting diffusion regions, and to develop methodology for forming such structures.

SUMMARY OF THE INVENTION

In one aspect, the invention encompasses a method of forming a semiconductor construction. A metal-rich metal silicide layer is formed on a silicon-comprising substrate, and a metal nitride layer is formed on the metal-rich metal silicide layer. The metal-rich metal silicide layer and metal nitride layer are thermally processed to convert some of the metal-rich metal silicide into a stoichiometric metal silicide region. The thermal processing also drives nitrogen from the metal nitride layer into the metal-rich metal silicide layer to convert some of the metal-rich metal silicide layer into a region comprising metal, silicon and nitrogen.

In another aspect, the invention encompasses a method of forming a semiconductor construction in which a composition of $TaSi_x$ is formed on a silicon-comprising substrate, with the x being less than 2. A tungsten nitride layer is formed over the composition $TaSi_x$, and a tungsten layer is formed over the tungsten nitride layer. Subsequently, silicon is incorporated from the silicon-comprising substrate into the $TaSi_x$ to convert at least some of the $TaSi_x$ into $TaSi_2$.

In other aspects, the invention encompasses semiconductor constructions comprising a layer of $MSi_2$ and a layer of $MSi_qN_r$, where M is Ta, W or Mo, and both q and r are greater than 0 and less than 2.

BRIEF DESCRIPTION OF THE DRAWINGS

Preferred embodiments of the invention are described below with reference to the following accompanying drawings.

FIG. 1 is fragmentary, diagrammatic, cross-sectional view of a semiconductor construction at a preliminary processing step of the present invention.

FIG. 2 is view of the FIG. 1 fragment shown at a processing step subsequent to that of FIG. 1.

FIG. 5 is a view of the FIG. 4 region shown at a processing step subsequent to that of FIG. 4, and corresponds to the region labeled "5" in FIG. 3.

FIG. 6 is a view of the FIG. 1 fragment, shown at a processing step subsequent to that of FIG. 3.

DETAILED DESCRIPTION OF THE PREFERRED EMBODIMENTS

Figure 3:
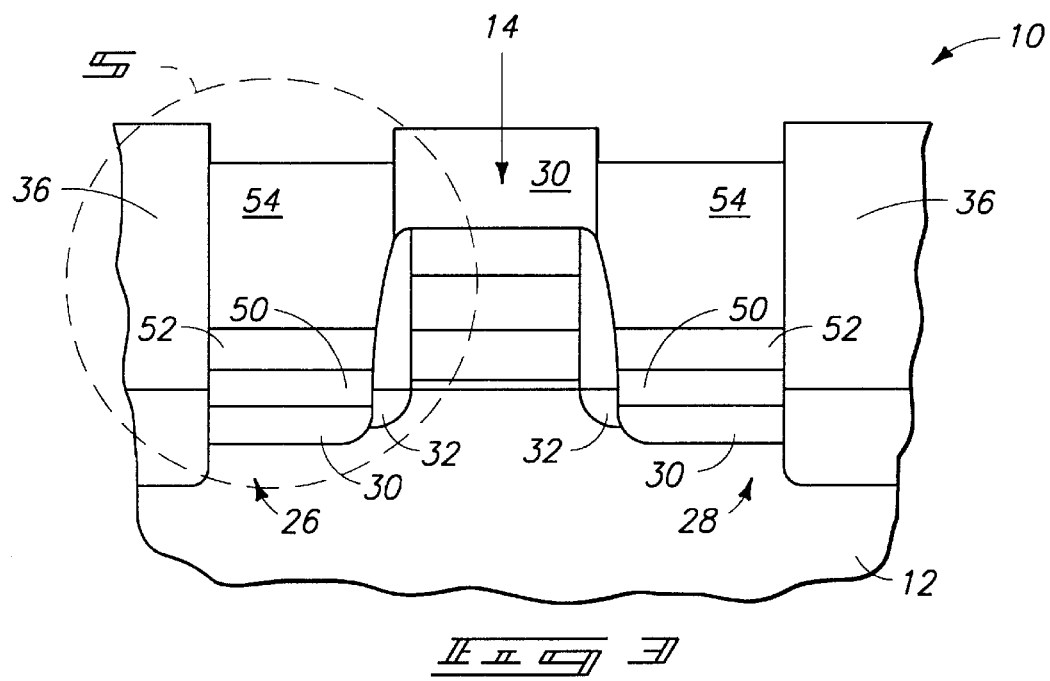
FIG. 3 is a view of the FIG. 1 fragment shown at processing step subsequent to that of FIG. 2.

This disclosure of the invention is submitted in furtherance of the constitutional purposes of the U.S. Patent Laws "to promote the progress of science and useful arts" (Article 1, Section 8).

A method encompassed by the present invention is described with reference to FIGS. 1–6. Referring initially to FIG. 1, a semiconductor wafer fragment 10 is illustrated at a preliminary processing step of the method of the present invention. Fragment 10 comprises a substrate 12, supporting a transistor gate 14. Substrate 12 can comprise silicon, and in particular embodiments can comprise amorphous silicon, polycrystalline silicon, or monocrystalline silicon. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Transistor gate 14 comprises a gate oxide layer 16 (typically a layer of silicon dioxide), a conductively-doped silicon layer 18 (typically conductively-doped polycrystalline silicon), a metal silicide layer 20 (typically titanium silicide or tungsten silicide), and an insulative cap 22 (typically silicon nitride). Transistor gate 14 can comprise other materials in addition to, or alternatively to, those discussed, including, for example, a layer of elemental metal, or metal alloys (such as, for example, a layer of tungsten or titanium).

A pair of insulative material sidewall spacers 24 are provided adjacent transistor gate 14, and can comprise, for example, either silicon dioxide or silicon nitride.

Source/drain regions 26 and 28 are formed within substrate 12, and each comprises a heavily-doped region 30, and a lightly-doped region 32. Heavily-doped regions 30 can comprise either p-type or n-type dopant, and accordingly can be either n-type or p-type doped regions. Similarly, lightly-doped regions 32 can also comprise either p-type or n-type conductivity-enhancing dopant, and can be either n-type or p-type doped regions. Heavily-doped regions 30 would typically comprise at least $1 \times 10^{19}$ atoms/cm$^3$ of dopant, and lightly-doped regions 32 would typically comprise less than $1 \times 10^{19}$ atoms/cm$^3$ of dopant.

Isolation regions 34 are formed within substrate 12, and can comprise, for example, shallow trench isolation regions containing silicon dioxide.

An insulative mass 36 is formed over substrate 12 and transistor gate 14, and can comprise, for example, borophosphosilicate glass (BPSG).

Openings 38 and 40 extend through insulative mass 36 to expose heavily-doped regions 30 of source/drain regions 26 and 28.

The construction 10 of FIG. 1 can be formed by conventional methods. Also, it is to be understood that the construction 10 of FIG. 1 can comprise materials alternatively to, or in addition to, those shown. For instance, insulative mass 36 can comprise a stack of insulative materials rather than a single material.

Referring to FIG. 2, a series of conductive materials are provided within openings 38 and 40 to provide conductive connections to diffusion regions 30 of source/drain regions 26 and 28.

The shown conductive materials include a metal-rich metal silicide layer provided over and in physical contact with substrate 12. It is noted that if substrate 12 comprises silicon, there may be a thin layer of native oxide (not shown) over diffusion regions 30. Such native oxide can be removed by a hydrofluoric acid etch prior to formation of conductive material 42, or alternatively may be disrupted during formation of layer 42.

Layer 42 is referred to as a "metal-rich" metal silicide layer to indicate that the ratio of metal to silicon is higher than that which would exist if layer 42 were stoichiometric for the metal silicide. For instance, if layer 42 comprises tantalum silicide, a stoichiometric composition would be TaSi$_2$ and a metal-rich composition would be TaSi$_x$, wherein x is greater than 0 and less than 2. In particular embodiments, layer 42 comprises a composition of MSi$_x$, wherein x is greater than 0 and less than 2, and wherein M is selected from the group consisting of Ta, W, and Mo. The composition can comprise, consist of, or consist essentially of, the MSi$_x$. In an exemplary method, layer 42 comprises, consists of, or consists essentially of TaSi$_x$, wherein x is greater than 0 and less than 2.

Layer 42 can be formed by, for example, physical vapor deposition (PVD), or chemical vapor deposition (CVD). In an exemplary embodiment, layer 42 is formed by physical vapor deposition from a sputtering target comprising a composite of metal and silicon (such as, for example, a composite of tantalum and silicon). In the shown embodiment, layer 42 is formed only at the bottom of openings 38 and 40, and not along sidewalls of the openings. Also, layer 42 is shown to be only within the openings, rather than over a top surface of mass 36. The shown construction can be formed by appropriate control of sputtering parameters to avoid formation of layer 42 along sidewalls of openings 38 and 40, together with utilization of planarization (such as, for example, chemical-mechanical polishing) to remove layer 42 from over the upper surface of mass 36. In other embodiments (not shown) layer 42 can be formed along sidewalls of openings 38 and 40, as well as along the bottom of the openings.

A second conductive layer 44 is formed over layer 42. Conductive layer 44 can comprise a metal nitride layer formed physically against metal-rich metal silicide layer 42. In particular embodiments, layer 44 will comprise a composition of MN$_y$, wherein y is from about 0.1 to about 1, and wherein M is a metal selected from the group consisting of tungsten, tantalum and titanium. In an exemplary embodiment, layer 44 comprises, consists of, or consists essentially of WN$_x$, wherein x is from about 0.1 to about 1. Layer 44 can be referred to as a "metal nitride", with such term being utilized to indicate that layer 44 comprises metal and nitrogen, and not to indicate that layer 44 comprises a stoichiometric ratio of metal to nitrogen unless such is specifically stated.

Layer 44 can be formed by either physical vapor deposition or chemical vapor deposition. In the shown embodiment, layer 44 is formed only along the upper surface of layer 42, rather than along sidewalls of openings 38 and 40, or along upper surfaces of mass 36. Such can be accomplished by appropriate control of deposition parameters, in combination with planarization, similarly to the procedures described above with reference to formation of layer 42. Also, it is to be understood that the invention encompasses other embodiments (not shown) wherein layer 44 extends along sidewalls of the openings, as well as over an upper surface of layer 42.

A layer 46 is formed over layer 44. Layer 46 comprises conductive material, and can comprise, for example, tungsten, copper, aluminum, titanium, or other metals; or can comprise conductively doped silicon. In an exemplary embodiment, layer 46 comprises, consists of, or consists essentially of tungsten. Layer 46 can be formed by chemical vapor deposition or physical vapor deposition, and can be formed utilizing techniques similar to those described above with reference to layers 42 and 44 to form layer 46 within openings 38 and 40 and not along sidewalls of the openings or along an upper surface of mass 36. Alternatively, the invention encompasses other embodiments (not shown) wherein layer 46 extends over and upper surface of mass 36 as well as within openings 38 and 40.

Layer 46 can comprise, consist of, or consist essentially of tungsten, copper, aluminum, titanium or conductively-doped silicon.

Referring to FIG. 3, construction 10 is illustrated after layer 42 (FIG. 2) is subjected to thermal processing conditions which convert at least some of the metal-rich metal silicide to a stoichiometric metal silicide region 50. Appropriate thermal processing conditions can include heating of fragment 10 to a temperature of at least 750° C. for a time of at least about 20 seconds, with preferred processing comprising heating fragment 10 to a temperature from about 750° C. to 800° C. for a time of at least about 20 seconds, and more preferably for a duration of at least about 30 seconds. The thermally processing can be accomplished by, for example, rapid thermal processing utilizing a ramp rate of at least about 10° C./second. The thermal processing can also cause diffusion of nitrogen from layer 44 (FIG. 2) into an upper region of layer 42 (FIG. 2) to form a region 52 comprising metal, silicon and nitrogen. More specifically, region 50 can comprise a composition having the formula $MSi_2$, and region 52 can comprise a composition having the formal $MSi_qN_r$, wherein both q and r are greater than 0 and less than 2; and wherein M is tantalum, tungsten or molybdenum.

In the shown embodiment, layer 44 (FIG. 2) consists essentially of a metal nitride (such as, for example, tungsten nitride) and layer 46 (FIG. 2) consists essentially of the same metal as that utilized in the metal nitride (such as, for example, tungsten). Further, the nitrogen of metal nitride layer 44 (FIG. 2) has been entirely driven downwardly into layer 42 to form the region 52, and to leave the metal. Such effectively converts layer 44 into a composition identical to that of layer 46, and accordingly a new layer 54 is defined comprising the metal from previous layers 44 and 46. In preferred embodiments in which tungsten nitride is utilized as layer 44, the nitrogen can be entirely driven from the tungsten nitride by processing at a temperature in excess of 750° C. for a duration of at least about 30 seconds (so-called denuding of the tungsten nitride). Further, if layer 46 comprises tungsten, such can effectively form a cap to prevent nitrogen diffusion upwardly from layer 44, and to force substantially all of the nitrogen from layer 44 to migrate downwardly into layer 42 and form the region 52.

Figure 4:
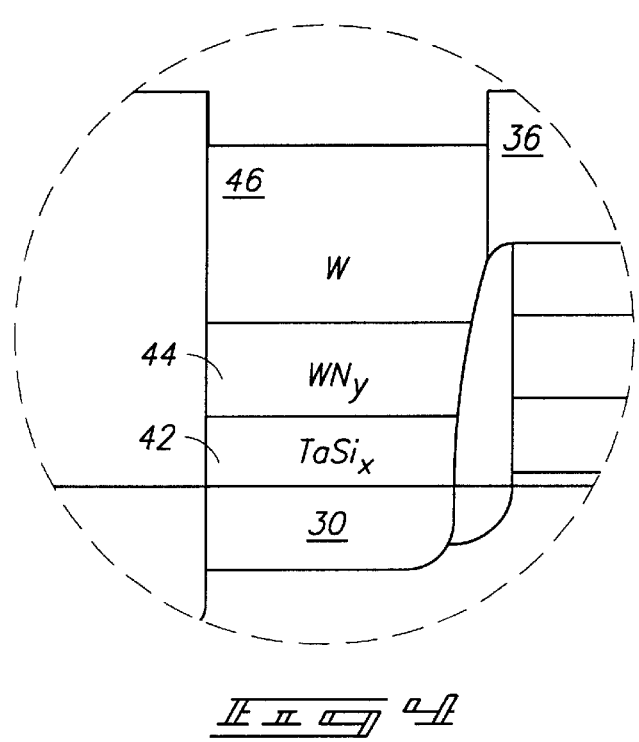
FIG. 4 is a view of the region labeled "4" in FIG. 2, and illustrating a particular embodiment of the present invention.

A preferred embodiment of the invention is illustrated in detail in FIG. 4 and 5, which show expanded regions of FIGS. 2 and 3, respectively. FIG. 4 illustrates layers 42, 44, and 46 comprising $TaSi_x$, $WN_y$, and W, respectively. FIG. 5 illustrates layers 50, 52 and 54 formed after thermal processing of the construction of FIG. 4. Specifically, FIG. 5 illustrates layer 50 comprising $TaSi_2$, layer 52 comprising $TaSi_qN_r$, and layer 54 comprising W.

An advantage of methodology of the present invention is that the amount of substrate 12 consumed in forming layer 50 can be controlled by the initial amount of Si present in layer 42. Specifically if layer 42 comprises $MSi_x$, the amount of silicon consumed in forming $MSi_2$ will decrease with increasing values of x. Accordingly, if x is chosen to be close to 2, there will be little silicon utilized from substrate 12 in forming $MSi_2$ from the $MSi_x$; and if x is chosen to be close to 0, there will be a substantial amount of silicon utilized from substrate 12. The amount of silicon removed from diffusion region 30 in forming the $MSi_2$ can be further reduced by increasing the size of region 52. Specifically, region 52 comprises a region wherein the $MSi_x$ has been converted to $MSi_qN_r$, rather than $MSi_2$. Accordingly, there is less silicon utilized in the conversion of a portion of layer 42 to the $MSi_qN_r$ of region 52 than is utilized in conversion of a portion of layer 42 to the $MSi_2$ of region 50. A size of region 52 can be increased by increasing an amount of nitrogen driven from layer 44 (FIG. 4) into layer 42 (FIG. 4). Such can be accomplished by having a higher concentration of nitrogen in the metal nitride of layer 44, and/or by providing a cap 46 which is relatively impermeable to nitrogen diffusion to force the nitrogen downwardly into layer 42 rather than allowing nitrogen to diffuse upwardly and away from layer 42. Further, the amount of nitrogen available for region 52 can be increased by increasing a thickness of layer 44. In preferred embodiments, layers 42, 44 and 46 will have respective thicknesses of from about 50 Å to about 200 Å, from about 50 Å to about 300 Å, and from about 100 Å to about 1000 Å.

Referring next to FIG. 6, such illustrates wafer fragment 10 in the view of FIGS. 1–3, and at a processing step subsequent to that of FIG. 3. A second insulative material 60 has been formed over substrate 12, and openings extend through mass 60 to the layers 54 over source/drain regions 26 and 28. A conductive interconnect 62 is formed within the opening in mass 60 over source/drain region 28 to from an electrical connection extending through layers 50, 52 and 54 to source/drain region 28. Material 62 can comprise numerous conductive materials, including for example, n-type or p-type doped silicon (such as amorphous silicon or polycrystalline silicon). If material 62 comprises conductively-doped silicon, it can be doped to the same type as source/drain region 30, or to a different type. Accordingly, material 62 can be doped to be an n-type material, and source/drain region 30 can likewise be an n-type doped region, or alternatively can be a p-type doped region. In yet other embodiments, material 62 can be doped to be a p-type doped material, and source/drain region 30 can likewise be doped to be a p-type doped region, or alternatively can be doped to be an n-type doped region. Conductive material 62 can be connected to a bitline 64 as part of a memory cell (for example, a DRAM cell) construction.

A capacitor construction 70 is formed in electrical connection with source/drain region 26 through conductive layers 50, 52 and 54. Capacitor construction 70 comprises a first electrical node 72, a second electrical node 74, and a dielectric material 76 between nodes 72 and 74. Nodes 72 and 74 can comprise, for example, conductively-doped silicon and/or metal-comprising materials. Dielectric material 76 can comprise, for example, silicon oxide, silicon nitride, and/or so-called high-k dielectric materials. The construction of FIG. 6 is an exemplary DRAM cell which can be formed in accordance with methodology of the present invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a semiconductor construction, comprising:

providing a silicon-comprising substrate;

forming a composition of $MSi_x$ on the silicon-comprising substrate, wherein x is greater than 0 and less than 2, and wherein M is selected from the group consisting of Ta, W and Mo;

thermal processing of the composition; the thermal processing incorporating silicon from the silicon-comprising substrate into the composition to convert at least some of the composition into $MSi_2$;

forming a metal nitride over the composition, the metal nitride being selected from the group consisting of tungsten nitride, tantalum nitride and titanium nitride; and forming a conductive material over the metal nitride.

2. The method of claim 1 wherein the conductive material comprises a layer which consists essentially of tungsten.

3. The method of claim 1 wherein the conductive material comprises a layer which consists essentially of copper.

4. The method of claim 1 wherein the conductive material comprises a layer which consists essentially of aluminum.

5. The method of claim 1 wherein the conductive material comprises a layer which consists essentially of titanium.

6. The method of claim 1 wherein the conductive material comprises a layer which consists essentially of conductively doped silicon.

7. A method of forming a semiconductor construction, comprising:

providing a silicon-comprising substrate;

forming a composition of $TaSi_x$ on the silicon-comprising substrate, wherein x is greater than 0 and less than 2;

forming a first layer over the composition, the first layer comprising tungsten and nitrogen;

forming a second layer over the first layer, the second layer comprising tungsten; and after forming the first and second layers; incorporating silicon from the silicon-comprising substrate into the composition to convert at least some of the composition from the $TaSi_x$ into $TaSi_2$.

8. The method of claim 7 wherein the silicon-comprising substrate comprises a conductively-doped diffusion region in a silicon material, and wherein the composition comprising $TaSi_x$ is formed to physically contact the diffusion region.

9. The method of claim 8 wherein the silicon material is monocrystalline silicon.

10. The method of claim 8 wherein the conductively-doped diffusion region is doped to be a p-type region.

11. The method of claim 8 wherein the conductively-doped diffusion region is doped to be an n-type.

12. The method of claim 7 wherein the incorporating comprises thermal processing of the substrate and $TaSi_x$ at a temperature of at least 750° C.

13. The method of claim 7 wherein the incorporating comprises thermal processing of the substrate, first layer and $TaSi_x$ at a temperature of at least 750° C.; and wherein nitrogen from the first layer migrates into the $TaSi_x$ during the thermal processing to convert some to the $TaSi_x$ into $TaSi_qN_r$, wherein both q and r are greater than 0 and less than 2.

14. The method of claim 7 further comprising forming conductively-doped silicon physically contacting the second layer.

15. The method of claim 14 wherein the conductively-doped silicon is p-type doped.

16. The method of claim 14 wherein the conductively-doped silicon is p-type doped and wherein the composition comprising $TaSi_x$ is physically against a p-type doped region of the silicon-comprising substrate.

17. The method of claim 14 wherein the conductively-doped silicon is p-type doped and wherein the composition comprising $TaSi_x$ is physically against an n-type doped region of the silicon-comprising substrate.

18. The method of claim 14 wherein the conductively-doped silicon is n-type doped.

19. The method of claim 14 wherein the conductively-doped silicon is n-type doped and wherein the composition comprising $TaSi_x$ is physically against a p-type doped region of the silicon-comprising substrate.

20. The method of claim 14 wherein the conductively-doped silicon is n-type doped and wherein the composition comprising $TaSi_x$ is physically against an n-type doped region of the silicon-comprising substrate.

* * * * *

UNITED STATES PATENT AND TRADEMARK OFFICE
CERTIFICATE OF CORRECTION

PATENT NO. : 6,593,234 B2
DATED : July 15, 2003
INVENTOR(S) : Yongjun Jeff Hu

It is certified that error appears in the above-identified patent and that said Letters Patent is hereby corrected as shown below:

Column 2,
Line 63, please insert -- a -- after "is".

Column 3,
Line 1, please insert -- a -- after "is".
Line 3, please insert -- a -- after "at".

Column 4,
Line 58, please delete "MNY" after "of" and insert -- $MN_y$ --.

Column 5,
Line 48, please delete "formal" before "$MSi_qN_r$" and insert -- formula --.

Column 6,
Line 46, please delete "from" after "to" and insert -- form --.

Signed and Sealed this

Tenth Day of February, 2004

JON W. DUDAS
*Acting Director of the United States Patent and Trademark Office*